(12) United States Patent
Qiu et al.

(10) Patent No.: US 6,806,491 B2
(45) Date of Patent: Oct. 19, 2004

(54) ORGANIC LIGHT-EMITTING DEVICES

(75) Inventors: Yong Qiu, Beijing (CN); Yudi Gao, Beijing (CN); Peng Wei, Beijing (CN); Deqiang Zhang, Beijing (CN); Liduo Wang, Beijing (CN)

(73) Assignee: Tsinghua University, Beijing (CN)

( * ) Notice: Subject to any disclaimer, the term of this patent is extended or adjusted under 35 U.S.C. 154(b) by 0 days.

(21) Appl. No.: 10/351,070

(22) Filed: Jan. 24, 2003

(65) Prior Publication Data

US 2003/0197465 A1 Oct. 23, 2003

(30) Foreign Application Priority Data

Apr. 3, 2002 (CN) .......................................... 02116537 A
Aug. 13, 2002 (CN) .......................................... 02125484 A

(51) Int. Cl.[7] .............................................. H01L 51/00
(52) U.S. Cl. ........................... 257/40; 257/15; 257/103; 313/504
(58) Field of Search ............................ 257/40, 15, 103; 313/504; 438/99

(56) References Cited

PUBLICATIONS

C. W. Tang and S. A. VanSlyke, "Organic electroluminescent diodes," *Appl. Phys. Lett.*, No. 51, vol. 2, Sep. 1997, pp. 913–915.

Yuji Hamada, Takeshi Sano, Kenichi Shibata, and Kazuhiko Kuroki, "Influence of the Emission Site on the Running Durability of Organic Electroluminescent Devices," *Jpn. J. Appl. Phys.*, vol. 34, 1995, pp. 824–826.

Min–Sik Jang, Seung–Yong Song, Hong–Ku Shim, Taehyoung Zyung, Sang–Don Jung, and Lee–Mi Do, "The enhancement of electroluminescence efficiency by molecular doping," *Synthetic Metals*, vol. 91, 1997, 317–319.

Hany Aziz, Zoran D. Popovic, Nan–Xing Hu, Ah–Mee Hor, and Gu Xu, "Degradation of Small Molecule–Based organic Light–Emitting Devices," *Science*, vol. 283, Mar. 19, 1999, pp. 1900–1902.

Hany Aziz and Zoran D. Popovic, "Study of organic light emitting devices with a 5,6,11,12–tetraphenylnaphthacene (rubrene)–doped hole transport layer," *Applied Physics Letters*, vol. 80, No. 12, Mar. 25, 2002, pp. 2180–2182.

Norio Tada, Satoshi Tatsuhara, Akihiko Fuji, Yutake Ohmori and Katsumi Yoshino, "Nonlinear Emission of 8–Hydroxyquinoline Aluminum and DiamineDerivative Superlattice Structures Exited by Third–Harmonic–Generation from Nd:YAG Laser Light,"*Jpn. J. Appl. Phys.*, vol. 36 (1997) pp. 421–424.

*Primary Examiner*—Sara Crane
(74) *Attorney, Agent, or Firm*—RatnerPrestia

(57) ABSTRACT

An organic light-emitting device including a transparent substrate, a first electrode layer, a second electrode layer, a hole-transporting layer, and a electron-transporting layer sandwiched between the first and second electrode layers, wherein the hole-transporting layer consists of organic multiple-quantum-well structure. The multiple-quantum-well structure has a period number of alternating layers formed of a layer of organic material A with wide energy gap and a layer of organic material B with narrow energy gap. Organic material A and organic material B are selected such that the highest occupied molecular orbital (HOMO) levels of organic material A are lower than those of organic material B and the lowest unoccupied molecular orbital (LUMO) levels of organic material A are higher than those of organic material B.

15 Claims, 5 Drawing Sheets

ORGANIC LIGHT-EMITTING DEVICES

BACKGROUND OF THE INVENTION

1. Field of the Invention

The present invention relates to organic light-emitting devices. More particularly, this invention provides highly luminance-efficient and bright organic light-emitting devices, and organic light-emitting devices with adjustable emission zone.

2. Description of the Related Arts

Recently, with the development of multimedia technology and the coming of information society, the requirement to high performance flat panel display becomes more and more emphasized. The recently developed three kinds of display technology, i.e. plasma display, field emission display and organic light-emitting display, can make up shortcomings of the CRT and LCD to a certain extent. Among them, organic light-emitting devices (OLEDs) show many advantages such as self-emission, low voltage operation, all-solid state, wide view angle, and full-color. The OLEDs also show a quick responding speed of up to 1000 times that of the LCD display and its manufacturing cost is relatively low comparing with the LCD display with same distinguishability. Thus, OLEDs show a great foreground in the display field.

In 1987, C. W. Tang et al. of Kodak Company reported a light-emitting diode with a double-layer structure of organic thin films, which is prepared by vapor deposition. Efficient injection of holes and electrons is provided from an indium-tin-oxide anode and an alloyed Mg:Ag cathode. High external quantum efficiency (1% photon/electron), luminous efficiency (1.51 m/W) and brightness (>1000 cd/m$^2$) were achievable at a drive voltage of 10V. (C. W. Tang, Applied Physics Letters. 51, 913 (1987)) In 1990, Burroughes et al. of Cambridge University found that polymer material showed excellent electroluminescent characteristics and fabricated the first polymer light-emitting diodes, thus extending the development of organic light-emitting diodes to polymer field. In the past ten years, many efforts have been made to improve the device performance.

It was recognized that OLEDs efficiency strongly depends on balance of holes and electrons. In the conventional NPB/Alq$_3$ OLEDs, mobility of the holes in NPB is much larger than mobility of the electrons in Alq$_3$, leading to unbalance of the holes and electrons in the emission zone.

It has been reported that using other appropriate hole-transporting materials or adopting novel device structure configurations is a good solution to enhance performances of the OLEDs. As one of the effective methods for reducing the hole mobility, it is tried to dope rubrene in hole-transporting layer in order to increase the OLEDs performances by Y. Hamada et al. and M. S. Jang et al. (Y. Hamada, T. Sano, K. Shibata, and K. Kuroki, Jpn. J. Appl. Phys., Part 2 34, L824 (1995); M. S. Jang, S. Y. Song, H. K. Shim, T. Zyung, S. D. Jung, L. M. Do, Synth. Met. 91, 317 (1997)) Aziz et al. proposed that the enhancement in these OLEDs performances is caused by the presence of rubrene molecules which act as hole traps in the devices. (H. Aziz, Z. Popovic, N. X. Hu, A. M. Hor, and G. Xu, Science 283, 1900 (1999); H. Aziz and Z. D. Popovic, Appl. Phys. Lett. 80, 2180 (2002)) On the other hand, organic multiple-quantum-well (MQW) structures have demonstrated to be helpful for obtaining narrower spectral emission, higher emission efficiency and tunable emission spectrum. But in the recent research works, all the MQW structures were introduced to enhance the concentration of the holes and electrons in the emission zone, resulting in high performances. N. Tada et al. (N. Tada, S. Tatsuhara, A. Fujii, Y. Ohmori and K. Yoshino, Jpn. J. Appl. Phys. 36, 421 (1997)) used Alq$_3$/TPD MQW structures in the emission layer and obtained a higher luminance efficiency compared with the conventional double-layer devices. Some further works showed that the enhancement was attributed to the increase of the concentration of carriers and the confinement of excitons in the emission layer. However, by using MQW structure in the light-emitting layer to increase the concentration of carriers, there is still an imbalance of carriers in the light-emission zone. And the superfluous holes will decrease the emitting efficiency. Thus it is relatively limited for enhancing the device efficiency by introducing MQW structure in the emission layer.

SUMMARY OF THE INVENTION

An object of the present invention is to provide highly luminance-efficient and bright organic light-emitting devices.

Another object of the present invention is to provide organic light-emitting devices with adjustable emission zone.

These objects are achieved by an organic light-emitting device comprising a transparent substrate, a first electrode layer, a second electrode layer, a hole-transporting layer and a electron-transporting layer sandwiched between the first and second electrode layers, wherein the hole-transporting layer includes organic multiple-quantum-well structure, and the multiple-quantum-well structure has a period number of alternating layers formed of a layer of organic material A with wide energy gap and a layer of organic material B with narrow energy gap. Organic material A and organic material B are selected such that their energy levels agree with the following relationships (I) and (II):

(I) highest occupied molecular orbital (HOMO) levels of organic material A are lower than those of organic material B;

(II) lowest unoccupied molecular orbital (LUMO) levels of organic material A are higher than those of organic material B.

The period number in the present invention is desirably an integer of 1 to 10.

The energy levels of the two organic materials in the hole-transporting layer in the present invention match each other (in agreement with the above relations (I) and (II)), thus the energy level of the organic material A can enwrap the energy level of the organic material B. Because the carriers at the interface of the two materials trend to move towards the low energy directions, thus the holes and electrons trend moving to the organic material B layer. Thus there is an energy gap for carriers at the interface of the organic material A and material B and the well of the electrons and holes are all in the organic material B. When the holes transport through the MQW structure, the majority of the holes distribute in the organic material B, and a few holes distribute in the organic material A. Furthermore, the holes can only transport through the organic material A by tunneling injection and consume some energy due to the existence of the hole energy barriers at the interface. Thus, it can be concluded that: (1) the energy consumed when the holes go through the interface increases with increase of the energy barrier at the interface. Thus more holes without enough energy will be confined in the organic material B and can't pass through the MQW structure; (2) with increase of the period number, the carriers have to traverse through more interfaces for going through the MQW structure. And more holes will be blocked at the interface, thus less holes can arrive to the emission zone. Therefore, the hole transport in the hole-transporting layer can be well controlled, and the balance injection of the hole and electron carriers can be obtained by choosing appropriate materials and period number of the MQW structure, resulting in high efficiency and luminance of the light-emitting devices.

The organic material B in the present invention can also be a kind of dye material C.

It was recognized that in the MQW transporting structure, (1) the carriers need to consume more energy to pass through the interfaces with the increase of the energy barriers therein, more carriers cannot pass through the MQW structure and will be confined in the organic material C due to their low energy and (2) the carriers need to pass through more interfaces with the increase of the period number, thus more carriers are blocked at the interfaces and cannot pass through the MQW structure either. Therefore, when the energy barrier at the interface of the MQW structure is small enough (<0.4 eV), the majority of the holes will be confined in the MQW structure, but a fraction of the holes can still transport through the MQW structure. At the same time, a fraction of the electrons recombine with the slight (i.e. small quantity of) holes in the electron-transporting layer, and the residual electrons transport into the MQW structure and recombine with the majority of the holes. Thus two emission zones will be obtained. By changing the period number of the organic MQW structure, the emission zone in the devices can be adjusted in the electron-transporting layer (period number is small enough and most of holes transport to electron-transporting layer and recombine with the electrons), hole-transporting layer (period number is large enough and the holes are all confined in MQW structure), or both the hole-transporting and electron-transporting layers. In one word, the recombination and emission zone are adjustable by controlling the period number of the organic MQW structure.

A buffer layer can be sandwiched between the first electrode and hole-transporting layer in the present invention, and a transitional layer can be sandwiched between the hole-transporting layer and electron-transporting layer.

The organic light-emitting devices in the present invention have below advantages:

1. The mobility of holes carriers in hole-transporting layer can be efficiently adjusted by the employment of the MQW structure. And hole-electron injection balance and high luminance efficiency can be obtained.
2. The devices show different emission zone as the period number changes when the organic material B with narrow energy gap is replaced by dye material C. Thus, the hole-electron recombination zone and emission zone of the organic light-emitting devices can be adjusted by controlling the period number of the organic MQW structure in the hole-transporting layer.

BRIEF DESCRIPTION OF THE DRAWINGS

The invention is better understood from the following detailed description when it is read with the accompanying drawings.

Each of FIG. 2 FIG. 3 also shows the distribution of carriers in the MQW devices.

The present invention will be illustrated in greater detail by exemplary embodiments thereof in the light of the accompanying drawings and detailed description, but the invention is not construed as being limited thereto.

DETAILED DESCRIPTION OF THE INVENTION

For simplifying expression, some materials used in this invention are abbreviated literally. The abbreviation, whole name, and corresponding molecular structure of the organic materials of present invention are shown in the below table 1.

TABLE 1

| Abbreviation | Whole name | Molecular structure |
|---|---|---|
| Alq$_3$ | tris(8-hydroxyquinoline) aluminum | 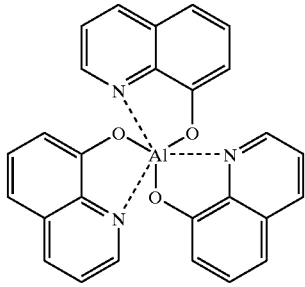 |

TABLE 1-continued

| Abbreviation | Whole name | Molecular structure |
| --- | --- | --- |
| Al(Saph-q) | salicylidene-o-aminophenolato (8-quinolinoato)aluminum | |
| BCP | 2,9-dimethyl-4,7-diphenyl-1,10-phenanthroline | |
| Bphen | 4,7-diphenyl-1,10-phenanthroline | |
| C545T | 10-(2-benzothiazolyl)-1,1,7,7-tetramethyl-2,3,6,7-tetrahydro-1H,5H,11H-[l]benzopyrano[6,7,8-ij]quinolizin-11-one | |
| CuPc | phthalocyanine copper | |

TABLE 1-continued

| Abbreviation | Whole name | Molecular structure |
| --- | --- | --- |
| DCJTB | 4-(dicyanomethylene)-2-(t-butyl)-6-(1,1,7,7-tetramethyljulolidyl-9-enyl)-4H-pyran | |
| DCM | 4-(dicyanomethylene)-2-methyl-6-(p-dimethylaminostyryl)-4H-pyran | |
| Ga(Saph-q) | salicylidene-o-aminophenolato (8-quinolinoato)gallium | |
| $H_2Pc$ | Phthalocyanine | |

TABLE 1-continued

| Abbreviation | Whole name | Molecular structure |
| --- | --- | --- |
| MTDATA | 4,4',4"-tris(3-methyl-phenylphenylamino)triphenylamine | |
| NPB | N,N'-bis-(1-naphthyl)-N,N'-diphenyl-1,1'-biphenyl-4,4'-diamine | |
| PANI | Polyaniline | |
| PBD | 2-(4-tert-Butylphenyl)-5-(4-biphenylyl)-1,3,4-oxadiazole | |
| PEDOT | Polyethylene dioxythiophene | |
| pentacene | pentacene | |

TABLE 1-continued

| Abbreviation | Whole name | Molecular structure |
|---|---|---|
| PVK | Poly(N-vinylcarbazole) | |
| rubrene | 5,6,11,12-tetraphenylnaphthacene | |
| TPBi | 2,2'2"-(1,3,5-benzenetriyl)-tris-[1-phenyl-1H-benzimidazole] | |
| TPD | N,N'-diphenyl-N,N'-bis(3-methylphenyl)-1,1'-biphenyl-4,4'-diamine | |
| VOPc | Phthalocyanine vanadium | |

TABLE 1-continued

| Abbreviation | Whole name | Molecular structure |
|---|---|---|
| Zn(Ac)$_2$ | 4-hydroxyl acridine zinc | |

In order to understand the present invention more clearly, some notes are listed below.

1. The emission zone of the OLEDs according to the present invention can be located in the electron-transporting layer and/or hole-transporting layer.
2. The hole-transporting layer, electron-transporting layer, buffer layer, and transitional layer mentioned in the present invention are all organic functional layers in the OLEDs.

Figure 1:
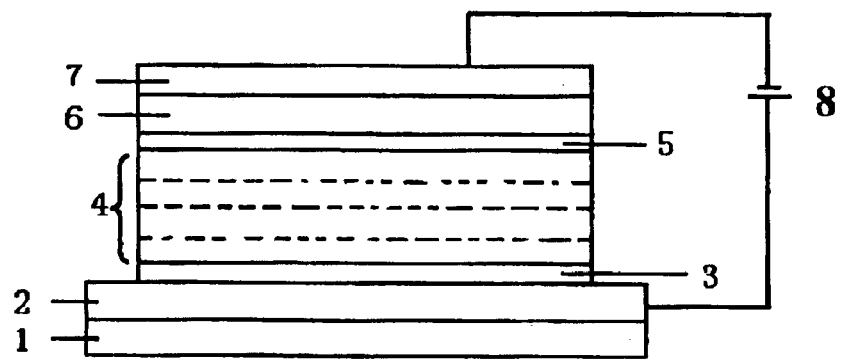
FIG. 1 is a schematic graph of the structure of the OLEDs according to the present invention (including optional buffer layer and transitional layer therein).
Figure 2:
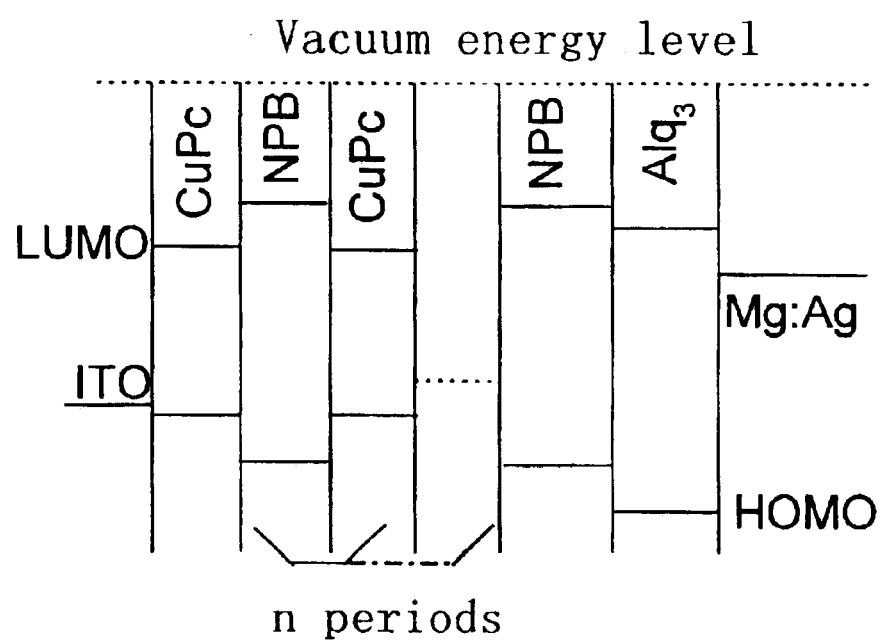
Figure 3:
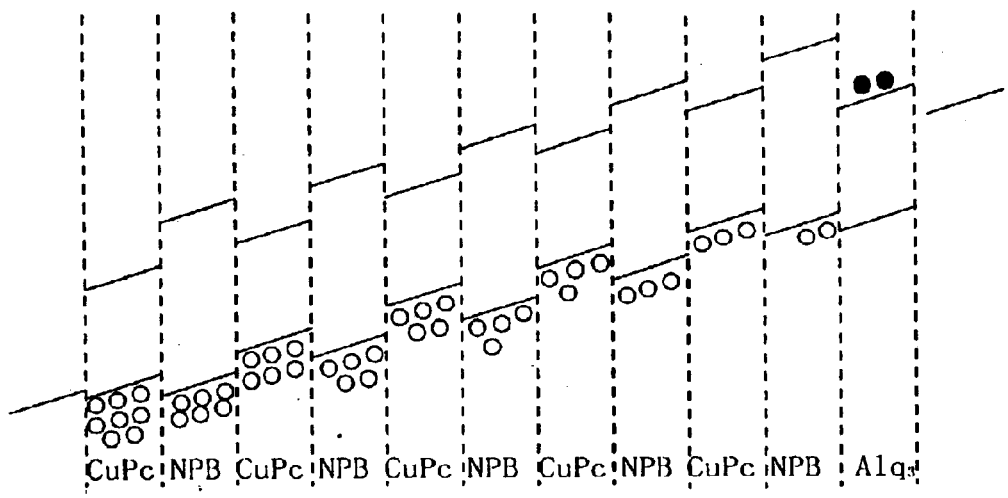
FIG. 3 is a schematic graph of energy level of the OLEDs having the structure configurations of Glass/ITO/CuPc/(NPB/CuPc)$_n$/NPB/Alq$_3$/Mg:Ag/Ag.

Structural configuration of the first type of the OLEDs according to the present invention is shown in FIG. 1. Reference numeral 1 is a transparent substrate, and it can be a glass substrate or a flexible substrate made of polyethylene terephthalate (PET) and polyimide (PI) materials. Reference numeral 2 is a first electrode (anode) layer, and it can be an inorganic material electrode or organic conducting polymer electrode. The inorganic electrode is commonly made of metal oxides such as indium-tin-oxide (ITO), zinc oxide, zinc-tin-oxide, or some metals with high work function such as gold, silver, and copper. A preferable anode is ITO film. A preferable organic polymer anode in this first type is PEDOT or PANI films. Reference numeral 3 is a buffer layer of a material selected from phthalocyanine derivatives, PI derivatives, fluoropolymer, inorganic fluorine-containing salt, inorganic oxides and diamond. A preferable buffer layer material in this first type is CuPc. Reference numeral 4 is a hole-transporting layer where an organic MQW structure is used. The organic quantum well structure consists of alternating layers of the organic material A with wide energy gap and of the organic material B with narrow energy gap. And energy level of the two organic materials in the hole-transporting layer matches each other (in agreement with the above relations (I) and (II)), thus the energy level of the organic material A can enwrap the energy level of the organic material B. Potential wells of the holes and electrons are all in the organic material B due to the energy barrier at the interfaces. The organic material A is a member selected from benzidine derivatives (such as NPB, TPD, MTDATA), carbazole derivatives (such as PVK, BCP, Bphen), pyrrole derivatives and oxadiazole derivatives materials (such as TPBi, PBD). The organic material B is a kind of phthalocyanine complex such as CuPc, H$_2$Pc, VOPc. And a preferable MQW structure in this first type is (NPB/CuPc)$_n$. The HOMO levels of NPB and CuPc are −5.5 eV and −4.8 eV respectively, and the LUMO levels of NPB and CuPc are −2.5 eV and −2.7 eV respectively. It can be seen from the energy schematic graph (FIG. 2, FIG. 3) that the holes and electrons wells are all formed in the CuPc layers due to the energy barrier at the interfaces of NPB/CuPc layers. Reference numeral 5 is a transitional layer which can match the energy level with the electron-transporting material. A preferable transitional material is NPB in the (NPB/CuPc)$_n$ organic MQW structure light-emitting devices. Reference numeral 6 is an electron-transporting layer and it can be a metal chelate complex or an oxadiazole complex. A preferable electron-transporting material is a member selected from Alq$_3$, Al(Saph-q), Ga(Saph-q) and Zn(Ac)$_2$. Reference numeral 7 is a second electrode (cathode) layer, and it can be a metal material with low work function selected from Li, Mg, Ca, Sr, Al, In and their alloy with gold or copper. A preferable second electrode is a Mg:Ag alloy layer and an Ag layer. And reference numeral 8 is an electric source.

A preferable example according to the above first type of the OLEDs has the following device structure (1):

Glass/ITO/CuPc/(NPB/CuPc)$_n$/NPB/Alq$_3$/Mg:Ag/Ag  (1)

Wherein n is period number, and is an integer of 1 to 10. Generally speaking, the device of the device structure (1) is fabricated by the following procedures successively.

1. A transparent conductive ITO-coated glass substrate is cleaned ultrasonically with boiling scour water and deionized (DI) water. Then the substrate is dried under infra-red lamp. The ITO film coated on glass substrate acts as anode layer. Sheet resistance of the ITO film is about 5–100 Ω/square, and the thickness of it is about 80.0–280.0 nm.
2. The cleaned and dried ITO-coated substrate is put in the vacuum of about 1×10$^{-5}$–5×10$^{-3}$ Pa. Then a CuPc film is vapor-deposited as a buffer layer of the OLEDs on the ITO film. The deposition rate of CuPc is about 0.02–0.4 nm/s and the resulting CuPc layer thickness is about 0.5–20.0 nm.
3. A hole-transporting layer is then vapor-deposited on the CuPc buffer layer. The hole-transporting layer is an organic quantum well structure consisting of alternating NPB/CuPc layer films with the period number of n. Here, the deposition rate of CuPc is about 0.02–0.4 nm/s, and the thickness of each CuPc film is about 0.5–10.0 nm. The deposition rate of NPB is about 0.1–0.6 nm/s, and the thickness of each NPB film is about 0.5–30.0 nm.
4. A NPB film is further vapor-deposited on the hole-transporting layer as transitional layer. The deposition rate is about 0.1–0.6 nm/s, and its layer thickness is about 10.0–45.0 nm.

5. An Alq$_3$ film is subsequently vapor-deposited on the NPB transitional layer as electron-transporting layer and electroluminescent emission layer. Here, the deposition rate of Alq$_3$ is about 0.1–0.6 nm/s, and its layer thickness is about 40.0–100.0 nm.
6. Finally, a Mg:Ag (their deposition rate ratio is about 10:1) metal alloy layer and an Ag layer are vapor-deposited as cathode on the Alq$_3$ layer, respectively. Here the total deposition rate of the Mg:Ag alloy layer is about 0.6–2.0 nm/s, and the total thickness of the alloy layer is about 50.0–200.0 nm. The deposition rate of the Ag layer is about 0.3–0.8 nm/s, and its layer thickness is about 40.0–200.0 nm.

Figure 6:
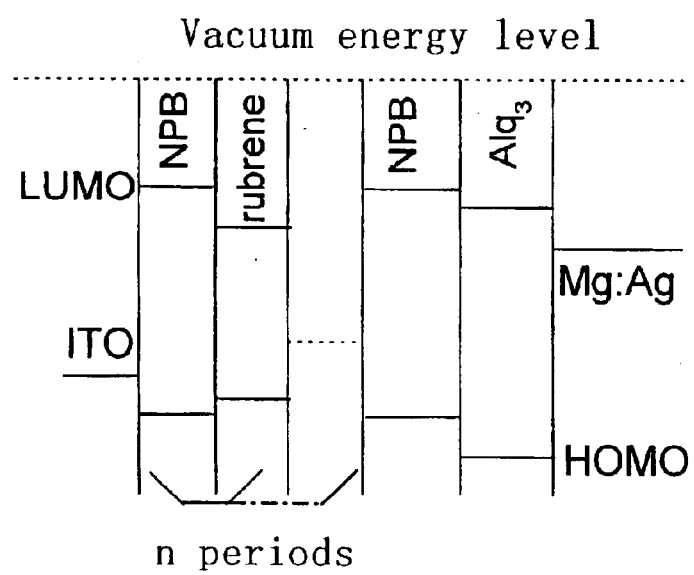
FIG. 6 is a energy level schematic graph of the OLEDs having the structure configurations of Glass/ITO/(NPB/rubrene)$_n$/NPB/Alq$_3$/Mg:Ag/Ag.

Structural configuration of the second type of the OLEDs according to the present invention can also be referred to FIG. 1, except for canceling buffer layer 3. Reference numerals 1 and 2 are same as in the above first type of the OLEDs. Reference numeral 4 is a hole-transporting layer where an organic MQW structure is used. The organic quantum well structure consists of alternating layers of the organic material A with wide energy gap and the organic material C with narrow energy gap. And energy level of the two organic materials in the hole-transporting layer matches each other (in agreement with the relations (I) and (II)), thus the energy level of the organic material A can enwrap the energy level of the organic material C. Potential wells of the holes and electrons are all in the organic material C due to the energy barrier at the interfaces. The organic material A is a member selected from benzidine derivatives (such as NPB, TPD, MTDATA), carbazole derivatives (such as PVK, BCP, Bphen), pyrrole derivatives and oxadiazole derivatives materials (such as TPBi, PBD). The organic material C is a kind of dye material selected from polyphenylene derivatives (such as rubrene, pentacene), coumarin derivatives (such as C545T) and bis-pyrane derivatives (such as DCTJB, DCM). And a preferable MQW structure in this second type is (NPB/rubrene)$_n$. The HOMO levels of NPB and rubrene are −5.5 eV and −5.4 eV respectively, and the LUMO levels of NPB and rubrene are −2.5 eV and −3.2 eV respectively. It can be seen from the energy schematic graph (FIG. 6) that the holes and electrons wells are all formed in the rubrene layers due to the energy barrier at the interfaces of NPB/rubrene films. Reference numeral 5 is a transitional layer which can match the energy level with the electron-transporting material. A preferable transitional material is NPB in the (NPB/rubrene)$_n$ organic MQW structure light-emitting devices. Reference numerals 6 and 7 are the same to that in the first type structure.

A preferable example according to the above second type of the OLEDs has the following device structure (2):

Glass/ITO/(NPB/rubrene)$_n$/NPB/Alq$_3$/Mg:Ag/Ag       (2)

Wherein n is period number, and is an integer of 1 to 10. Generally speaking, the device of the device structure (2) is fabricated by the following procedures successively.

1. A transparent conductive ITO-coated glass substrate is cleaned ultrasonically with boiling scour water and DI water. Then the substrate is dried under infra-red lamp. The ITO film coated on glass substrate acts as anode layer. Sheet resistance of the ITO film is about 5–100 Ω/square, and the thickness of it is about 80.0–280.0 nm.
2. The cleaned and dried ITO-coated substrate is put in the vacuum of about 1×10$^{-5}$–5×10$^{-3}$ Pa. Then a hole-transporting layer is vapor-deposited on the ITO layer. The hole-transporting layer is an organic quantum well structure consisting of alternating NPB/rubrene layer films with the period number of n. Here, the deposition rate of rubrene is about 0.02–0.4 nm/s, and the thickness of each rubrene layer is about 0.5–10.0 nm. The deposition rate of NPB is about 0.1–0.6 nm/s, and the thickness of each NPB layer is about 0.5–30.0 nm.
3. A NPB film is further vapor-deposited on the hole-transporting layer as transitional layer. The deposition rate is about 0.1–0.6 nm/s, and its layer thickness is about 10.0–45.0 nm.
4. An Alq$_3$ film is subsequently vapor-deposited on the NPB transitional layer as electron-transporting layer and electroluminescent emission layer. Here, the deposition rate of Alq$_3$ is about 0.1–0.6 nm/s, and its layer thickness is about 40.0–100.0 nm.
5. Finally, a Mg:Ag (their deposition rate ratio is about 10:1) metal alloy layer and an Ag layer are vapor-deposited as cathode on the Alq$_3$ layer, respectively. Here the total deposition rate of the Mg:Ag alloy layer is about 0.6–2.0 nm/s, and the total thickness of the alloy layer is about 50.0–200.0 nm. The deposition rate of the Ag layer is about 0.3–0.8 nm/s, and its layer thickness is about 40.0–200.0 nm.

EXAMPLES 1 TO 3

Figure 4:
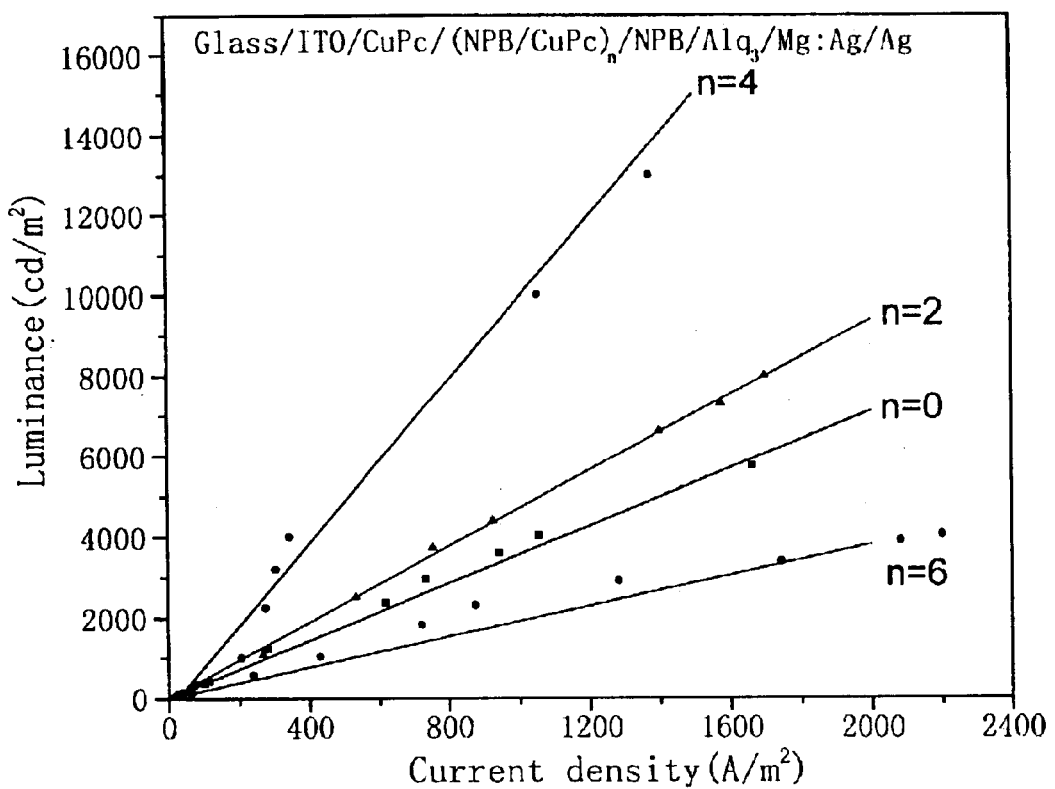
FIG. 4 is a graph of luminance versus current density relationship of the MQW light-emitting devices according to the present invention with different period numbers n. (the device has the structure configurations of Glass/ITO/CuPc/(NPB/CuPc)$_n$/NPB/Alq$_3$/Mg:Ag/Ag)
Figure 5:
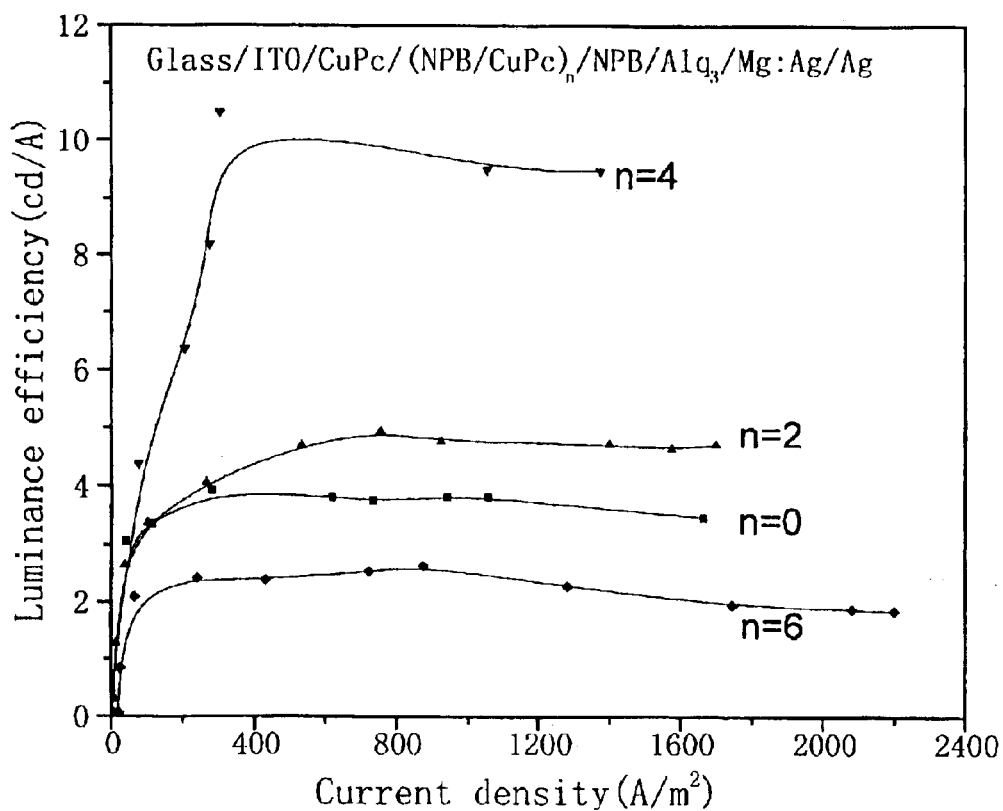
FIG. 5 is a graph of luminance efficiency versus current density relationship of the MQW light-emitting devices having the structure configurations of Glass/ITO/CuPc/(NPB/CuPc)$_n$/NPB/Alq$_3$/Mg:Ag/Ag with different period numbers n.

Three exemplary OLEDs were fabricated in compliance with the same procedures as above described towards the device structure (1). In order to compare the device performance conveniently, the ITO layer in the three devices was kept to 200.0 nm in thickness, CuPc film (constituting the CuPc buffer layer) was kept to 6.0 nm, and NPB film (constituting the transitional layer) was kept to 15.0 nm. The thickness of the Alq$_3$ layer as the electron transporting layer was 60.0 nm, and the thickness of the Mg:Ag alloy layer and the Ag layer was 100.0 nm respectively. Each film thickness of the alternating NPB/CuPc layer films in the three OLEDs were changed with three different period numbers n, but the total thicknesses of the NPB films and CuPc films of n periods were substantially kept to 15.0 nm and 6.0 nm respectively. The device structure configurations of the three OLEDs were shown in tables 2 and 3. Luminance-current density curve and luminance efficiency-current density curve were shown in FIG. 4 and FIG. 5 respectively.

COMPARATIVE EXAMPLE 1

A conventional OLED was fabricated in the same manner as described in examples 1 to 3, except that no alternating NPB/CuPc layer film was formed and the period-number n was 0 as well as total thickness of the CuPc and NPB layers was 12.0 nm and 30.0 nm respectively, as shown in table 3. The resulting device has the following device structure (3):

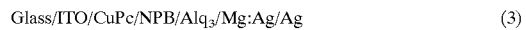
Glass/ITO/CuPc/NPB/Alq$_3$/Mg:Ag/Ag       (3)

The following table 3 exhibited the influence of period number n on the device performances of NPB/CuPc organic quantum well light-emitting devices.

TABLE 2

| | n | Structure of OLED |
|---|---|---|
| C. Ex. 1 | 0 | Glass/ITO/CuPc(12.0 nm)/NPB(30.0 nm)/Alq$_3$(60.0 nm)/Mg:Ag/Ag |
| Ex. 1 | 2 | Glass/ITO/CuPc(6.0 nm)/[NPB(7.5 nm)/CuPc(3.0 nm)]$_2$/NPB(15.0 nm)/Alq$_3$(60.0 nm)/Mg:Ag/Ag |
| Ex. 2 | 4 | Glass/ITO/CuPc(6.0 nm)/[NPB(3.8 nm)/CuPc(1.5 nm)]$_4$/NPB(15.0 nm)/Alq$_3$(60.0 nm)/Mg:Ag/Ag |
| Ex. 3 | 6 | Glass/ITO/CuPc(6.0 nm)/[NPB(2.5 nm)/CuPc(1.0 nm)]$_6$/NPB(15.0 nm)/Alq$_3$(60.0 nm)/Mg:Ag/Ag |

TABLE 3

| | | Comparative Example 1 | Example 1 | Example 2 | Example 3 |
|---|---|---|---|---|---|
| | | Period number | | | |
| | | 0 | 2 | 4 | 6 |
| Layer | Material | Thickness (nm) | | | |
| Anode layer | ITO | 200.0 | | | |
| Buffer layer | CuPc | 12.0 | 6.0 | 6.0 | 6.0 |
| Hole-transporting layer | NPB | 0 | 7.5 | 3.8 | 2.5 |
| | CuPc | 0 | 3.0 | 1.5 | 1.0 |
| Transitional layer | NPB | 30.0 | 15.0 | 15.0 | 15.0 |
| Electron-transporting layer | Alq$_3$ | 60.0 | | | |
| Cathode layer | Mg:Ag | 100.0 | | | |
| | Ag | 100.0 | | | |
| Device performance | Current density (A/m$^2$) | 400 | | | |
| | Luminance (cd/m$^2$) | 1400 | 1960 | 3900 | 800 |
| | Luminance efficiency (cd/A) | 3.8 | 4.3 | 9.8 | 2.3 |
| | Initial luminance (cd/m$^2$) | 1000 | | | |
| | T$_{1/2}$ (h) | 2.5 | 2.7 | 3.5 | 2 |
| | Life time (h) | 25 | 27 | 35 | 20 |

It can be seen from Table 3 that the device with period number 4 achieved best characteristics. A highest efficiency of 10.8 cd/A can be obtained at current density of 34 mA/cm$^2$. This was an improvement over previously reported result about the efficiency of the Alq$_3$ devices without dye dopant. It is also about 3 times that of the conventional devices without an alternating NPB/CuPc layer film (n=0).

Although when period number n equaled 6, the film formation quality of the quantum well structure declined, it should be understood the reason was that the thickness of each layer was too small, leading to poor device performance. It is believed that the device performance increases with increase of the period number provided that thickness of the various layers is not so small as to cause formation difficulty of the device.

EXAMPLE 4

A transparent conductive ITO-coated glass substrate was cleaned ultrasonically with boiling scour water and DI water. Then the substrate was dried under infra-red lamp. The ITO film coated on glass substrate acted as anode layer. Sheet resistance of the ITO film was 15 Ω/square, and the thickness of it was 180.0 nm. The cleaned and dried ITO-coated substrate was put in the vacuum of 1×10$^{-3}$ Pa. Then a CuPc film was vapor-deposited as a buffer layer on the ITO film. The deposition rate of CuPc was about 0.04 nm/s and the resulting layer thickness was 6.0 nm. A hole-transporting layer was further vapor-deposited on the CuPc buffer layer. The hole-transporting layer was an organic quantum well structure consisting of alternating NPB/CuPc layer films with the period number of 6. Here, the deposition rate of CuPc was 0.04 nm/s, and the thickness of each CuPc film was about 1.5 nm. The deposition rate of NPB was 0.2 nm/s, and the thickness of each NPB film was about 3.8 nm. A NPB film was subsequently vapor-deposited on the hole-transporting layer as transitional layer. The deposition rate of NPB was about 0.4 nm/s, and the resulting layer thickness was 15.0 nm. An Alq$_3$ film was then vapor-deposited on the NPB transitional layer as electron-transporting layer and electroluminescent emission layer. Here, the deposition rate of Alq$_3$ was 0.2 nm/s, and its layer thickness was about 60.0 nm. Finally, a Mg:Ag (their deposition rate ratio was 10:1) metal alloy layer and an Ag layer were vapor-deposited as cathode layer on the Alq$_3$ layer, respectively. Here the total deposition rate of the Mg:Ag alloy layer was 1.5 nm/s, and the total thickness of the alloy layer was 100.0 nm. The deposition rate of the Ag layer was about 0.5 nm/s, and its layer thickness was 100.0 nm.

A turn-on voltage of 2.5V, a highest luminance of 16000 cd/m$^2$, and a highest efficiency of 10.8 cd/A at the current density of 36 mA/cm$^2$ were achieved by the resultant device.

EXAMPLE 5

A transparent conductive ITO-coated glass substrate was cleaned ultrasonically with boiling scour water and DI water. Then the substrate was dried under infra-red lamp. The ITO film coated on glass substrate acted as anode layer. Sheet resistance of the ITO film was 60 Ω/square, and the thickness of it was 100.0 nm. The cleaned and dried ITO-coated substrate was put in the vacuum of 2×10$^{-3}$ Pa. Then a CuPc film was vapor-deposited as a buffer layer on the ITO film. The deposition rate of CuPc was about 0.06 nm/s and the resulting layer thickness was 8.0 nm. A hole-transporting layer was further vapor-deposited on the CuPc buffer layer. The hole-transporting layer was an organic quantum well structure consisting of alternating NPB/CuPc layer films with the period number of 2. Here, the deposition rate of CuPc was 0.06 nm/s, and the thickness of each CuPc film was about 3.0 nm. The deposition rate of NPB was 0.2 nm/s, and the thickness of each NPB film was about 7.5 nm. A NPB film was subsequently vapor-deposited on the hole-transporting layer as transitional layer. The deposition rate was about 0.2 nm/s, and the resulting layer thickness was 20.0 nm. An Al(Saph-q) film was then vapor-deposited on the NPB transitional layer as electron-transporting layer and electroluminescent emission layer. Here, the deposition rate of Al(Saph-q) was 0.2 nm/s, and its layer thickness was about 60.0 nm. Finally, a Mg:Ag (their deposition rate ratio was 10:1) metal alloy layer and an Ag layer were vapor-deposited as cathode on the Al(Saph-q) layer, respectively. Here the total deposition rate of the Mg:Ag alloy layer was 1.5 nm/s, and the total thickness of the alloy layer was 150.0 nm. The deposition rate of the Ag layer was about 0.4 nm/s, and its layer thickness was 50.0 nm.

A turn-on voltage of 2.8V and a highest luminance of 13000 cd/m$^2$ were achieved by the resultant device.

EXAMPLE 6

A transparent conductive ITO-coated glass substrate was cleaned ultrasonically with boiling scour water and DI water. Then the substrate was dried under infra-red lamp. The ITO film coated on glass substrate acted as anode layer. Sheet resistance of the ITO film was 30 Ω/square, and the thickness of it was 140.0 nm. The cleaned and dried ITO-coated substrate was put in the vacuum of 1.5×10$^{-3}$ Pa. Then a CuPc film was vapor-deposited as a buffer layer on the ITO film. The deposition rate was about 0.03 nm/s and the resulting layer thickness was 4.0 nm. A hole-transporting layer was further vapor-deposited on the CuPc buffer layer. The hole-transporting layer was an organic quantum well structure consisting of alternating NPB/CuPc layer films with the period number of 8. Here, the deposition rate of CuPc was 0.02 nm/s, and the thickness of each CuPc film was about 0.75 nm. The deposition rate of NPB was 0.2 nm/s, and the thickness of each NPB film was about 2.0 nm. A NPB film was subsequently vapor-deposited on the hole-transporting layer as transitional layer. The deposition rate was about 0.2 nm/s, and the resulting layer thickness was 20.0 nm. A Zn(Ac)$_2$ film was then vapor-deposited on the NPB transitional layer as electron-transporting layer and electroluminescent emission layer. Here, the deposition rate of Zn(Ac)$_2$ was 0.2 nm/s, and its layer thickness was about 60.0 nm. Finally, a Mg:Ag (their deposition rate ratio was 10:1) metal alloy layer and an Ag layer were vapor-deposited as cathode on the Zn(Ac)$_2$ layer, respectively. Here the total deposition rate of the Mg:Ag alloy layer was 1.5 nm/s, and the total thickness of the alloy layer was 180.0 nm. The deposition rate of the Ag layer was about 0.5 nm/s, and its layer thickness was 50.0 nm.

A turn-on voltage of 2.9V and a highest luminance of 12000 cd/m$^2$ were achieved by the resultant device.

EXAMPLES 7 TO 9

Figure 7:
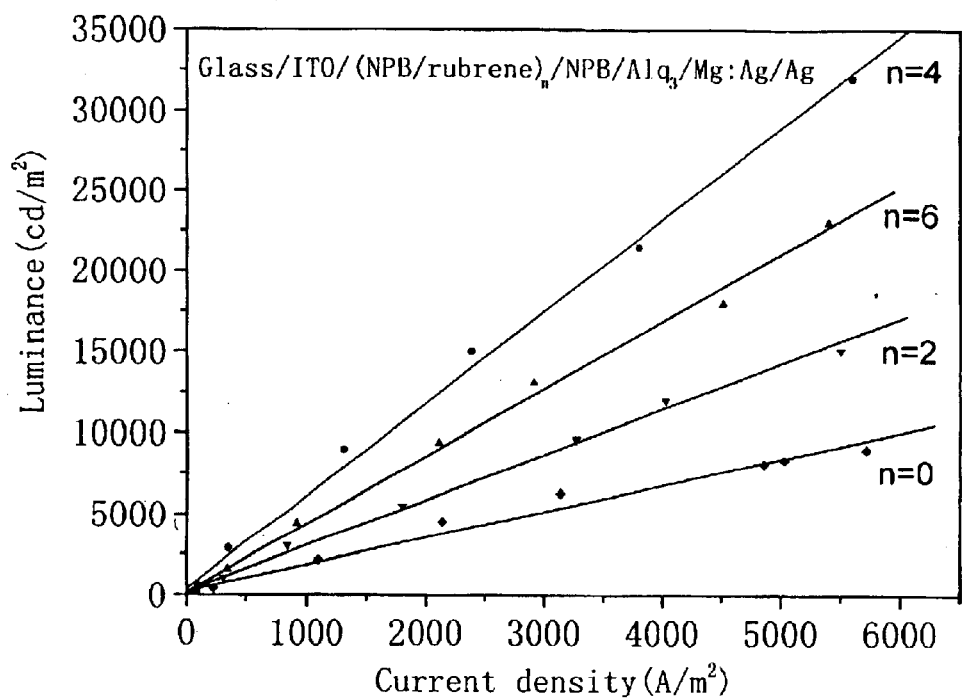
FIG. 7 is a graph of luminance versus current density relationship of the MQW light-emitting devices having the structure configurations of Glass/ITO/(NPB/rubrene)$_n$/NPB/Alq$_3$/Mg:Ag/Ag with different period numbers n.
Figure 8:
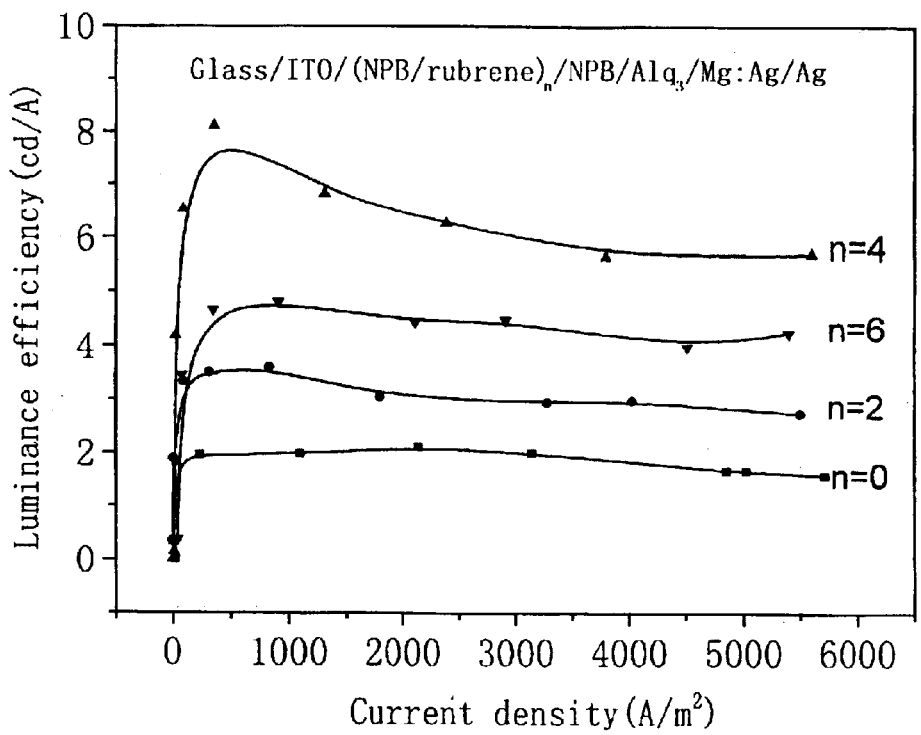
FIG. 8 is a graph of luminance efficiency versus current density relationship of the MQW light-emitting devices having the structure configurations of Glass/ITO/(NPB/rubrene)$_n$/NPB/Alq$_3$/Mg:Ag/Ag with different period numbers n.

Three exemplary OLEDs were fabricated in compliance with the same procedure as above described towards the device structure (2). In order to compare the device performance conveniently, thickness of the ITO film in the devices was kept to 240.0 nm, and total thickness of NPB film (including transitional layer) was kept to 40.0 nm. Total thickness of n-layers of the alternating rubrene films was substantially kept to 8.0 nm, but each NPB film was constantly kept to 5.0 nm. The thickness of Alq$_3$ layer was 60.0 nm, and the thickness of the Mg:Ag alloy layer and the Ag layer was 100.0 nm respectively. But alternating NPB/rubrene layer films in the three OLEDs were changed with three different period numbers n. The device structures of the three OLEDs were shown in tables 4 and 5. Luminance-current density curve and luminance efficiency-current density curve were shown in FIG. 7 and FIG. 8 respectively.

COMPARATIVE EXAMPLE 2

A conventional OLED was fabricated in the same manner as described in examples 7 to 9, except that no alternating NPB/rubrene layer film was formed and the period number n was 0. The resulting device had the following device structure (4), also as shown in table 4. Thickness of the NPB layer was 40.0 nm.

Glass/ITO/NPB/Alq$_3$/Mg:Ag/Ag (4)

TABLE 4

|  | n | Structure of OLED |
|---|---|---|
| C. Ex. 2 | 0 | Glass/ITO/NPB(40.0 nm)/Alq$_3$(60.0 nm)/Mg:Ag/Ag |
| Ex. 7 | 2 | Glass/ITO/[NPB(5.0 nm)/rubrene(4.0 nm)]$_2$/NPB(30.0 nm)/Alq$_3$(60.0 nm)/Mg:Ag/Ag |
| Ex. 8 | 4 | Glass/ITO/[NPB(5.0 nm)/rubrene(2.0 nm)]$_4$/NPB(20.0 nm)/Alq$_3$(60.0 nm)/Mg:Ag/Ag |
| Ex. 9 | 6 | Glass/ITO/[NPB(5.0 nm)/rubrene(1.3 nm)]$_6$/NPB(10.0 nm)/Alq$_3$(60.0 nm)/Mg:Ag/Ag |

COMPARATIVE EXAMPLE 3

A conventional OLED was fabricated in the same manner as described in examples 7 to 9, except that no alternating NPB/rubrene layer film was formed and the period number n was 0, but the electron-transporting layer consisted of 60.0 nm Alq$_3$ layer doped with 2 wt % rubrene. The resulting device had the following device structure (5), also as shown in table 5.

Glass/ITO/NPB/Alq$_3$:rubrene (2 wt %)/Mg:Ag/Ag (5)

Figure 9:
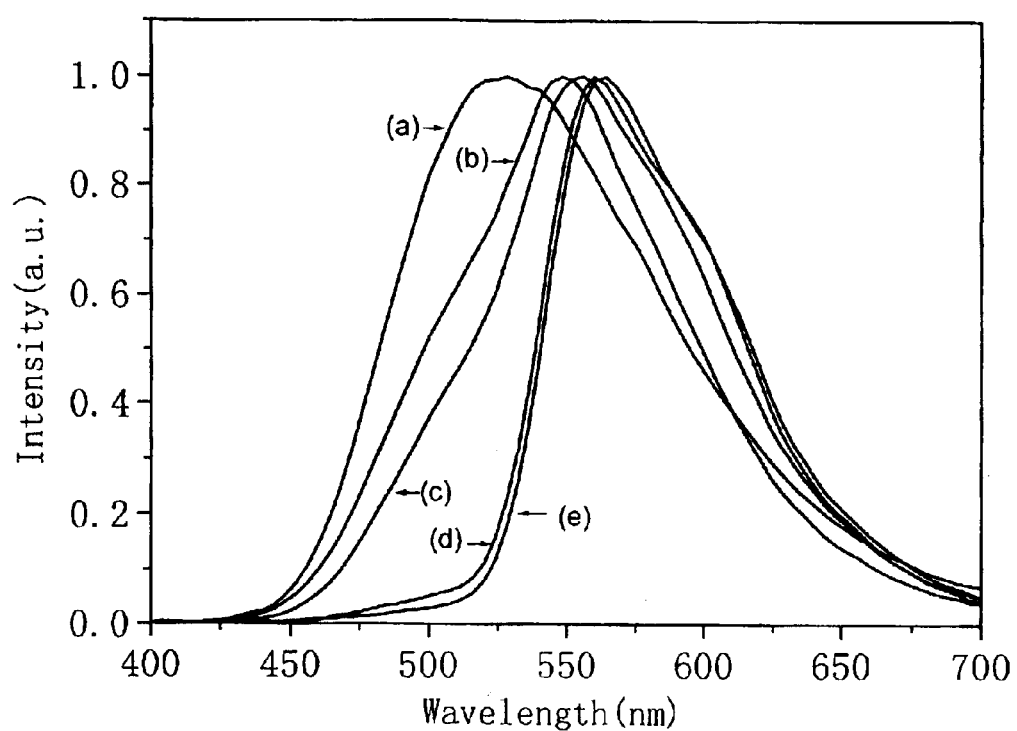
FIG. 9 is graph of the electroluminescent (EL) spectra of the OLEDs according to the present invention with different period numbers n and the EL spectrum of the device with the device structure configuration (5) as defined hereinafter (all the EL spectra is normalized, and for curve (a) n=0, for curve (b) n=2, for curve (c) n=4, for curve (d) n=6, and for curve (e) the device has the structure configuration (5))

The EL spectra of the above OLEDs were shown in FIG. 9. The curves (a), (b), (c) and (d) corresponded to organic quantum well light-emitting devices with the period number of 0, 2, 4 and 6 respectively. The curve (e) corresponded to the device of the above device structure (5) and showed a yellow light emission originated from rubrene. In the NPB/rubrene MQW structure according to the invention, a distinct shift of the emitting spectrum had been observed with increase of the period number n. Here, the n=0 device (curve a) showed pure Alq$_3$ emission characteristics, while the n=2 device (curve b) and the n=4 device (curve c) showed emission characteristics of rubrene with a small Alq$_3$ emission component as a shoulder at 520 nm. It was interesting to point out that the n=6 device (curve d) showed pure rubrene emission characteristics which were the same as the conventional device without MQW structure (curve e), and Alq$_3$ emission was hardly visible, indicating that the carrier recombination were confined in the rubrene layers only.

The EL spectra study revealed that the MQW structure can not only adjust the holes mobility in the devices, but also control the emitting zone and output wavelength in the devices due to the hole distribution and confinement in the MQW structures.

In summary, when introduced into OLEDs as a hole-transporting layer, organic MQW of NPB/rubrene can efficiently control the hole mobility and help to achieve hole-electron balance. Dye material is vapor-deposited as a separate layer in the present invention. The EL spectra study reveals that the MQW structure can even control emitting zone in the devices due to the hole distribution and confinement in the MQW structures. This work may provide useful clues on how to obtain different emission colors from the OLEDs.

Table 5 exhibited the influence of period number n on device performance of NPB/rubrene organic quantum well light-emitting devices.

possible to destroy the uniform quantum well structure, and the device efficiency decreased. In fact, it was expected to enhance the device efficiency by increasing the period number if multiple quantum structure was not destroyed. It was interesting to find that, with the increase of period number n, the proportion of rubrene emission in the EL spectrum became higher, and the emission color showed a red shift. This proved that the emission zone in the device transferred to rubrene layer with the increase of period number. The larger period number n is, the more light rubrene layer emits.

EXAMPLES 10 TO 13

Examples 10 to 13 were carried out according to the same manner and procedures as in the examples 7 to 9, except that the period numbers kept constantly at 4, and the device

TABLE 5

| | | C. Ex. 2 | Example 7 | Example 8 | Example 9 | C. Ex. 3 |
|---|---|---|---|---|---|---|
| | | | | Period number | | |
| | | 0 | 2 | 4 | 6 | 0 |
| Layer | Material | | | Thickness (nm) | | |
| Anode layer | ITO | 240.0 | | | | |
| Hole-transporting layer | NPB | 0 | 5.0 | 5.0 | 5.0 | 0 |
| | rubrene | 0 | 4.0 | 2.0 | 1.3 | 0 |
| Transitional layer | NPB | 40.0 | 30.0 | 20.0 | 10.0 | 40.0 |
| Electron-transporting layer | Alq$_3$ | 60.0 | 60.0 | 60.0 | 60.0 | 60.0 (2 wt % rubrene-doped) |
| Cathode layer | Mg:Ag | 100.0 | | | | |
| | Ag | 100.0 | | | | |
| Device performance | Current density(A/m$^2$) | 3000 | | | | |
| | Luminance (cd/m$^2$) | 6160 | 9000 | 17800 | 13500 | |
| | Luminance efficiency (cd/A) | 2.01 | 3.03 | 6.00 | 4.46 | |
| | Wavelength (nm) | 528 | 548 | 556 | 560 | 564 |

It can be seen from Table 5 that the OLED with period number 4 showed the best luminance and efficiency. When period number was 6, each layer in the organic quantum well was too thin, the film quality became poor, even it was possible structures of the resulting OLEDs were shown in table 6. Meanwhile, the following table 6 also exhibited the influence of NPB thickness on device performance of NPB/rubrene organic quantum well light-emitting devices.

TABLE 6

| | | Example 10 | Example 11 | Example 12 | Example 13 |
|---|---|---|---|---|---|
| | | | Period number 4 | | |
| Layer | Material | | Thickness (nm) | | |
| Anode layer | ITO | 240.0 | | | |
| Hole-transporting layer | NPB | 1.0 | 3.0 | 5.0 | 7.0 |
| | rubrene | 2.0 | | | |
| Transitional layer | NPB | 36.0 | 28.0 | 20.0 | 12.0 |
| Electron-transporting layer | Alq$_3$ | 60.0 | | | |
| Cathode layer | Mg:Ag | 100.0 | | | |
| | Ag | 100.0 | | | |
| Device performance | Current density (A/m$^2$) | 3000 | | | |
| | Luminance (cd/m$^2$) | 15000 | 24000 | 18000 | 17400 |
| | Luminance efficiency (cd/A) | 5.00 | 8.00 | 6.00 | 5.80 |

It can be seen from table 6 that the OLEDs showed best performance with 3.0 nm thickness of the NPB layers. When thickness was 1.0 nm, the performances became worse due to poor film quality in the organic quantum well structure. Generally speaking, the smaller thickness of NPB layer leads to a higher performance.

EXAMPLES 14 TO 17

Examples 14 to 17 were carried out according to the same manner and procedures as in the examples 7 to 9, except that the period numbers kept constantly at 4, and the device structures of the resulting OLEDs were shown in table 7. Meanwhile, the following table 7 also exhibited the influence of rubrene thickness on device performance of the NPB/rubrene organic quantum well light-emitting devices.

nm, the organic quantum well structure was destroyed. Relatively thin films can be obtained by choosing appropriate fabrication conditions. A preferable thickness is 2.0 nm.

EXAMPLES 18 TO 21

Examples 18 to 21 were carried out according to the same manner and procedures as in examples 7 to 9, except that the period number kept constantly at 4, and the device structures of the resulting OLEDs were shown in Table 8.

TABLE 7

| | | Example 14 | Example 15 | Example 16 | Example 17 |
|---|---|---|---|---|---|
| | | Period number 4 | | | |
| Layer | Material | Thickness (nm) | | | |
| Anode layer | ITO | 240.0 | | | |
| Hole-transporting layer | NPB | 5.0 | | | |
| | rubrene | 1.0 | 2.0 | 4.0 | 6.0 |
| Transitional layer | NPB | 20.0 | | | |
| Electron-transporting layer | $Alq_3$ | 60.0 | | | |
| Cathode layer | Mg:Ag | 100.0 | | | |
| | Ag | 100.0 | | | |
| Device performance | Current density ($A/m^2$) | 3000 | | | |
| | Luminance ($cd/m^2$) | 10500 | 18000 | 15000 | 15000 |
| | Luminance efficiency (cd/A) | 3.50 | 6.00 | 5.00 | 5.00 |

It can be seen from table 7 that the influence of rubrene thickness on device performance of NPB/rubrene organic quantum well light-emitting devices was not obvious. Only when the thickness of the rubrene layer was as low as 1.0

The following table 8 exhibited the influence of different electron-transporting materials and MQW structure materials on device performance of the organic quantum well light-emitting devices.

TABLE 8

| | | Example 18 | Example 19 | Example 20 | Example 21 |
|---|---|---|---|---|---|
| | | Period number 4 | | | |
| Layer | Material | Thickness (nm) | | | |
| Anode layer | ITO | 240.0 | | | |
| Hole-transporting layer | NPB barrier | 5.0 | 5.0 | 5.0 | 5.0 |
| | Well Material | CuPc | rubrene | rubrene | DCJTB |
| | | 2.0 | 2.0 | 2.0 | 2.0 |
| Transitional layer | NPB | 20.0 | 20.0 | 20.0 | 20.0 |
| Electron-transporting layer | Material | $Alq_3$ | $Alq_3$ | Al(Saph-q) | Ga(Saph-q) |
| | | 60.0 | 60.0 | 60.0 | 60.0 |
| Cathode | Mg:Ag | 100.0 | | | |
| | Ag | 100.0 | | | |
| Device performance | Current density ($A/m^2$) | 3000 | | | |
| | Luminance ($cd/m^2$) | 22000 | 17800 | 25800 | 9500 |
| | Luminance efficiency (cd/A) | 7.03 | 5.90 | 8.60 | 3.17 |
| | Wavelength (nm) | 528 | 550 | 560 | 620 |

EXAMPLES 22 TO 24

Examples 22 to 24 were carried out according to the same manner and procedures as in examples 7 to 9, except for the device structures of the resulting OLEDs were shown in table 9.

COMPARATIVE EXAMPLE 4

An OLED was fabricated in the same manner as described in examples 22 to 24, except that no alternating NPB/rubrene layer film was formed and the period number n was 0, and the remaining structure configurations of the resulting OLED being shown in table 9.

Meanwhile, table 9 exhibited also the influence of period number n on device performance of the NPB/rubrene organic quantum well light-emitting devices.

A turn-on voltage of 2.8V and a highest luminance of 16000 cd/m² were achieved by the resultant device.

EXAMPLE 26

A transparent conductive ITO-coated glass substrate was cleaned ultrasonically with boiling scour water and DI water. Then the substrate was dried under infra-red lamp. The ITO film coated on glass substrate acted as anode layer. Sheet resistance of the ITO film was 15 Ω/square, and the thickness of it was 260.0 nm. The cleaned and dried ITO-coated substrate was put in the vacuum of $1\times10^{-3}$ Pa. Then a CuPc film was vapor-deposited as buffer layer on the ITO film. The deposition rate of CuPc was about 0.02 nm/s and the resulting thickness was 10.0 nm. A hole-transporting layer was further vapor-deposited on the CuPc buffer layer. The hole-transporting layer was an organic quantum well

TABLE 9

| | | C. Example 4 | Example 22 | Example 23 | Example 24 |
|---|---|---|---|---|---|
| | | Period number | | | |
| | | 0 | 2 | 4 | 6 |
| Layer | Material | Thickness (nm) | | | |
| Anode layer | ITO | 240.0 | | | |
| Hole-transporting layer | NPB | 0 | 5.0 | 5.0 | 5.0 |
| | rubrene | 0 | 8.0 | 2.0 | 1.3 |
| Transitional layer | NPB | 40.0 | 35.0 | 20.0 | 10.0 |
| Electron-transporting layer | Alq₃ | 60.0 | | | |
| Cathode layer | Mg:Ag | 100.0 | | | |
| | Ag | 100.0 | | | |
| Device performance | Initial luminance (cd/m²) | 1000 | | | |
| | $T_{1/2}$ (h) | 2.5 | 2.4 | 2.6 | 1.5 |
| | Life time (h) | 25 | 24 | 26 | 15 |

EXAMPLE 25

A transparent conductive ITO-coated glass substrate was cleaned ultrasonically with boiling scour water and DI water. Then the substrate was dried under infra-red lamp. The ITO film coated on glass substrate acted as anode layer. Sheet resistance of the ITO film was 60 Ω/square, and the thickness of it was 100.0 nm. The cleaned and dried ITO-coated substrate was put in the vacuum of $2\times10^{-3}$ Pa. Then a hole-transporting layer was vapor-deposited on the ITO layer. The hole-transporting layer was an organic quantum well structure consisting of alternating NPB/rubrene layer films with the period number of 4. Here, the deposition rate of rubrene was 0.1 nm/s, and the thickness of each rubrene film was about 2.0 nm. The deposition rate of NPB was 0.2 nm/s, and the thickness of each NPB film was about 5.0 nm. A NPB film was further vapor-deposited on the hole-transporting layer as transitional layer. The deposition rate was about 0.2 nm/s, and its thickness was 20.0 nm. An Al(Saph-q) film was subsequently vapor-deposited on the NPB transitional layer as electron-transporting layer and electroluminescent emission layer. Here, the deposition rate of Al(Saph-q) was 0.2 nm/s, and its layer thickness was about 60.0 nm. Finally, a Mg:Ag (their deposition rate ratio was 10:1) metal alloy layer and an Ag layer were vapor-deposited as cathode layer on the Al(Saph-q) layer, respectively. Here the total deposition rate of the Mg:Ag alloy layer was 15 nm/s, and the total thickness of the alloy layer was 150.0 nm. The deposition rate of the Ag layer was about 0.4 nm/s, and its layer thickness was 50.0 nm.

structure consisting of alternating NPB/rubrene layer films with the period number of 3. Here, the deposition rate of rubrene was 0.1 nm/s, and the thickness of each rubrene film was about 2.0 nm. The deposition rate of NPB was 0.2 nm/s, and the thickness of each NPB film was about 5.0 nm. A NPB film was subsequently vapor-deposited on the hole-transporting layer as transitional layer. The deposition rate was about 0.2 nm/s, and its thickness was 20.0 nm. An Al(Saph-q) film was then vapor-deposited on the NPB transitional layer as electron-transporting layer and electroluminescent emission layer. Here, the deposition rate of Al(Saph-q) was 0.2 nm/s, and its layer thickness was about 60.0 nm. Finally, a Mg:Ag (their deposition rate ratio was 10:1) metal alloy layer and an Ag layer were vapor-deposited as cathode layer on the Al(Saph-q) layer, respectively. Here the total deposition rate of the Mg:Ag alloy layer was 1.5 nm/s, and the total thickness of the alloy layer was 150.0 nm. The deposition rate of the Ag layer was about 0.4 nm/s, and its layer thickness was 50.0 nm.

A turn-on voltage of 2.5V and a highest luminance of 26000 cd/m² were achieved by the resultant device.

EXAMPLE 27

A transparent conductive ITO-coated glass substrate was cleaned ultrasonically with boiling scour water and DI water. Then the substrate was dried under infra-red lamp. The ITO film coated on glass substrate acts as anode layer. Sheet resistance of the ITO film was 100 Ω/square, and the thickness of it was 60.0 nm. The cleaned and dried ITO-coated substrate was put in the vacuum of $2\times10^{-3}$ Pa. Then a hole-transporting layer was vapor-deposited on the ITO layer. The hole-transporting layer was an organic quantum well structure consisting of alternating MTDATA/rubrene layer films with the period number of 10. Here, the deposition rate of rubrene was 0.1 nm/s, and the thickness of each rubrene film was about 2.0 nm. The deposition rate of MTDATA was 0.2 nm/s, and the thickness of each MTDATA film was about 5.0 nm. A NPB film was further vapor-deposited on the hole-transporting layer as transitional layer. The deposition rate was about 0.2 nm/s, and its thickness was 5.0 nm. An $Alq_3$ film was subsequently vapor-deposited on the NPB transitional layer as electron-transporting layer and electroluminescent emission layer. Here, the deposition rate of $Alq_3$ was 0.2 nm/s, and its layer thickness was about 60.0 nm. Finally, a Mg:Ag (their deposition rate ratio was 10:1) metal alloy layer and an Ag layer were vapor-deposited as cathode layer on the $Alq_3$ layer, respectively. Here the total deposition rate of the Mg:Ag alloy layer was 1.5 nm/s, and the total thickness of the alloy layer was 150.0 nm. The deposition rate of the Ag layer was about 0.4 nm/s, and its layer thickness was 50.0 nm.

A turn-on voltage of 2.8V and a highest luminance of 14000 $cd/m^2$ were achieved by the resultant device.

EXAMPLE 28

A transparent conductive ITO-coated glass substrate was cleaned ultrasonically with boiling scour water and DI water. Then the substrate was dried under infra-red lamp. The ITO film coated on glass substrate acted as anode layer. Sheet resistance of the ITO film was 60 Ω/square, and the thickness of it was 100.0 nm. The cleaned and dried ITO-coated substrate was put in the vacuum of $2\times10^{-3}$ Pa. Then a hole-transporting layer was vapor-deposited on the ITO layer. The hole-transporting layer was an organic quantum well structure consisting of alternating TPD/DCJTB layer films with the period number of 4. Here, the deposition rate of DCJTB was 0.1 nm/s, and the thickness of each DCJTB film was about 2.0 nm. The deposition rate of TPD was 0.2 nm/s, and the thickness of each TPD film was about 5.0 nm. A TPD film was further vapor-deposited on the hole-transporting layer as transitional layer. The deposition rate was about 0.2 nm/s, and its thickness was 20.0 nm. An $Alq_3$ film was subsequently vapor-deposited on the TPD transitional layer as electron-transporting layer and electroluminescent emission layer. Here, the deposition rate of $Alq_3$ was 0.2 nm/s, and its layer thickness was about 60.0 nm. Finally, a Mg:Ag (their deposition rate ratio was 10:1) metal alloy layer and an Ag layer were vapor-deposited as cathode layer on the $Alq_3$ layer, respectively. Here the total deposition rate of the Mg:Ag alloy layer was 1.5 nm/s, and the total thickness of the alloy layer was 150.0 nm. The deposition rate of the Ag layer was about 0.4 nm/s, and its layer thickness was 50.0 nm.

A turn-on voltage of 2.8V and a highest luminance of 12000 $cd/m^2$ were achieved by the resultant device.

EXAMPLE 29

A transparent conductive ITO-coated glass substrate was cleaned ultrasonically with boiling scour water and DI water. Then the substrate was dried under infra-red lamp. The ITO film coated on glass substrate acted as anode layer. Sheet resistance of the ITO film was 40 Ω/square, and the thickness of it was 150.0 nm. The cleaned and dried ITO-coated substrate was put in the vacuum of $1\times10^{-3}$ Pa. Then a hole-transporting layer was vapor-deposited on the ITO layer. The hole-transporting layer was an organic quantum well structure consisting of alternating MTDATA/rubrene layer films with the period number of 4. Here, the deposition rate of rubrene was 0.2 nm/s, and the thickness of each rubrene film was about 2.0 nm. The deposition rate of MTDATA was 0.2 nm/s, and the thickness of each MTDATA film was about 5.0 nm. A MTDATA film was further vapor-deposited on the hole-transporting layer as transitional layer. For this transitional layer, the deposition rate was about 0.2 nm/s, and the resulting thickness was 20.0 nm. An $Alq_3$ film was vapor-deposited on the MTDATA transitional layer as electron-transporting layer and electroluminescent emission layer. Here, the deposition rate of $Alq_3$ was 0.2 nm/s, and its layer thickness was about 60.0 nm. Finally, a Mg:Ag (their deposition rate ratio was 10:1) metal alloy layer and an Ag layer were vapor-deposited as cathode layer on the $Alq_3$ layer, respectively. Here the total deposition rate of the Mg:Ag alloy layer was 1.5 nm/s, and the total thickness of the alloy layer was 150.0 nm. The deposition rate of the Ag layer was about 0.4 nm/s, and its layer thickness was 50.0 nm.

A turn-on voltage of 2.8V and a highest luminance of 18000 $cd/m^2$ were achieved by the resultant device.

EXAMPLE 30

A transparent conductive ITO-coated glass substrate was cleaned ultrasonically with boiling scour water and DI water. Then the substrate was dried under infra-red lamp. The ITO film coated on glass substrate acted as anode layer. Sheet resistance of the ITO film was 10 Ω/square, and the thickness of it was 280.0 nm. The cleaned and dried ITO-coated substrate was put in the vacuum of $4\times10^{-3}$ Pa. Then a hole-transporting layer was vapor-deposited on the ITO layer. The hole-transporting layer was an organic quantum well structure consisting of alternating NPB/C545T layer films with the period number of 4. Here, the deposition rate of C545T was 0.1 nm/s, and the thickness of each C545T film was about 2.0 nm. The deposition rate of NPB was 0.2 nm/s, and the thickness of each NPB film was about 5.0 nm. A NPB film was further vapor-deposited on the hole-transporting layer as transitional layer. The deposition rate of NPB was about 0.2 nm/s, and the resulting thickness was 20.0 nm. An $Alq_3$ film was vapor-deposited on the NPB transitional layer as electron-transporting layer and electroluminescent emission layer. Here, the deposition rate of $Alq_3$ was 0.2 nm/s, and its layer thickness was about 60.0 nm. Finally, a Mg:Ag (their deposition rate ratio was 10:1) metal alloy layer and an Ag layer were vapor-deposited as cathode layer on the $Alq_3$ layer, respectively. Here the total deposition rate of the Mg:Ag alloy layer was 1.5 nm/s, and the total thickness of the alloy layer was 150.0 nm. The deposition rate of the Ag layer was about 0.4 nm/s, and its layer thickness was 50.0 nm.

A turn-on voltage of 2.5V and a highest luminance of 28000 $cd/m^2$ were achieved by the resultant device.

EXAMPLE 31

A transparent conductive ITO-coated glass substrate was cleaned ultrasonically with boiling scour water and DI water. Then the substrate was dried under infra-red lamp. The ITO film coated on glass substrate acted as anode layer. Sheet resistance of the ITO film was 20 Ω/square, and the thickness of it was 220.0 nm. The cleaned and dried ITO-coated substrate was put in the vacuum of $3\times10^{-3}$ Pa. Then a hole-transporting layer was vapor-deposited on the ITO layer. The hole-transporting layer was an organic quantum well structure consisting of alternating MTDATA/DCM layer films with the period number of 5. Here, the deposition rate of DCM was 0.05 nm/s, and the thickness of each DCM film was about 2.0 nm. The deposition rate of MTDATA was 0.1 nm/s, and the thickness of each MTDATA was about 5.0 nm. A NPB film was further vapor-deposited on the hole-transporting layer as transitional layer. The deposition rate was about 0.2 nm/s, and its thickness was 20.0 nm. A Bphen film was subsequently vapor-deposited on the NPB transitional layer as electron-transporting layer. Here, the deposition rate of Bphen was 0.2 nm/s, and its layer thickness was about 60.0 nm. Finally, a Mg:Ag (their deposition rate ratio was 10:1) metal alloy layer and an Ag layer were vapor-deposited as the cathode on Bphen layer, respectively. Here the total deposition rate of the Mg:Ag alloy layer was 1.5 nm/s, and the total thickness of the alloy layer was 150.0 nm. The deposition rate of the Ag layer was about 0.4 nm/s, and its layer thickness was 50.0 nm.

A turn-on voltage of 2.5V and a highest luminance of 28000 $cd/m^2$ were achieved by the resultant device.

While this invention has been described in terms of some preferred examples, it should also be understood that there are alterations, permutations, and equivalents which fall within the scope of this invention.

What is claimed:

1. An organic light-emitting device comprising:
   a transparent substrate;
   a first electrode layer;
   a second electrode layer;
   a hole-transporting layer; and
   a electron-transporting layer sandwiched between the first electrode layer and second electrode layer;
   wherein,
     the hole-transporting layer includes an organic multiple-quantum-well structure, and the multiple-quantum-well structure has a period number of alternating layers formed of a layer of organic material A with wide energy gap and a layer of organic material B with narrow energy gap;
     highest energy occupied molecular orbital levels of the organic material A are lower than highest energy occupied molecular orbital levels of the organic material B; and
     lowest energy unoccupied molecular orbital levels of the organic material A are higher than lowest energy unoccupied molecular orbital levels of the organic material B.

2. The organic light-emitting device of claim 1, wherein the period number of multiple-quantum-well structure is an integer of 1 to 10.

3. The organic light-emitting device of claim 1, wherein the organic material A layer is in the range of about 0.5 to 30.0 nm in thickness, and the organic material B layer is in the range of about 0.5 to 10.0 nm in thickness.

4. The organic light-emitting device of claim 1, wherein the organic material B is a dye material.

5. The organic light-emitting device of claim 2, wherein the organic material B is a dye material.

6. The organic light-emitting device of claim 1, wherein:
   a buffer layer is introduced between the first electrode layer and the hole-transporting layer; and
   a transitional layer is introduced between the hole-transporting layer and the electron-transporting layer.

7. The organic light-emitting device of claim 6, wherein: the buffer layer is formed by phthalocyanine copper material; and the transitional layer is formed by N,N'-bis-(1-naphthyl)-N,N'-diphenyl-1,1'-biphenyl-4,4'-diamine material.

8. The organic light-emitting device of claim 1, wherein: the organic material A is a material selected from the group consisting of benzidine derivatives, carbazole derivatives, pyrrole derivatives and oxadiazole derivatives; and the organic material B is a phthalocyanine complex.

9. The organic light-emitting device of claim 8, wherein:
   the benzidine derivatives include;
     N,N'-bis-(1-naphthyl)-N,N'-diphenyl-1,1'-biphenyl-4, 4'-diamine;
     N,N'-diphenyl-N,N'-bis(3-methylphenyl)-1,1'-biphenyl-4,4'-diamine; and
     4,4',4"-tris(3-methyl-phenylphenylamino) triphenylamine;
   the carbazole derivatives include;
     poly (N-vinylcarbazole);
     2,9-dimethyl-4,7-diphenyl-1,10-phenanthroline;
     4,7-diphenyl-1,10-phenanthroline;
   the oxadiazole derivatives include;
     2,2',2"-(1,3,5-benzenetriyl)-tris-[1-phenyl-1H-benzimidazole]; and
     2-(4-tert-Butylphenyl)-5-(4-biphenylyl)-1,3,4-oxadiazole; and
   the phthalocyanine complex includes at least one of;
     phthalocyanine copper;
     phthalocyanine; and
     phthalocyanine vanadium.

10. The organic light-emitting device of claim 8, wherein:
    the organic material A is N,N'-bis-(1-naphthyl)-N,N'-diphenyl-1,1'-biphenyl-4,4'-diamine; and
    the organic material B is phthalocyanine copper.

11. The organic light-emitting device of claim 1, wherein the electron-transporting layer is formed by at least one of a metal chelate complex and a oxadiazole complex.

12. The organic light-emitting device of claim 11, wherein the metal chelate complex is a material selected from the group consisting of:
    tris(8-hydroxyquinoline) aluminum;
    salicylidene-o-aminophenolato (8-quinolinoato) aluminum;
    salicylidene-o-aminophenolato (8-quinolinoato) gallium; and
    4-hydroxyl acridine zinc.

13. The organic light-emitting device of claim 4, wherein:
    the organic material A is a material selected from the group consisting of benzidine derivatives, carbazole derivatives, pyrrole derivatives and oxadiazole derivatives; and
    the dye material is a material selected from the group consisting of polyphenylene derivatives, coumarin derivatives and bis-pyrane derivatives.

14. The organic light-emitting device of claim 13, wherein:
    the polyphenylene derivatives include;
      5,6,11,12-tetraphenylnaphthacene; and
      pentacene;
    the coumarin derivatives include 10-(2-benzothiazolyl)-1,1,7,7-tetramethyl-2,3,6,7-tetrahydro-1H,5H,11H-[1] benzopyrano[6,7,8-ij]quinolizin-11-one; and
    the bis-pyrane derivatives include;
      4-(dicyanomethylene)-2-(t-butyl)-6-(1,1,7,7-tetramethyljulolidyl-9-enyl)-4H-pyran; and
      4-(dicyanomethylene)-2-methyl-6-(p-dimethylamino-styryl)-4H-pyran.

15. The organic light-emitting device of claim 13, wherein:
    the organic material A is N,N'-bis-(1-naphthyl)-N,N'-diphenyl-1,1'-biphenyl-4,4'-diamine; and
    the dye material is 5,6,11,12-tetraphenylnaphthacene.

* * * * *